(12) United States Patent
Sakaida et al.

(10) Patent No.: US 9,632,414 B2
(45) Date of Patent: Apr. 25, 2017

(54) COATING LIQUID TO BE APPLIED TO RESIST PATTERN AND METHOD FOR FORMING REVERSE PATTERN

(71) Applicant: NISSAN CHEMICAL INDUSTRIES, LTD., Tokyo (JP)

(72) Inventors: Yasushi Sakaida, Toyama (JP); Rikimaru Sakamoto, Toyama (JP); Shuhei Shigaki, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/909,313

(22) PCT Filed: Jul. 22, 2014

(86) PCT No.: PCT/JP2014/069341
§ 371 (c)(1),
(2) Date: Feb. 1, 2016

(87) PCT Pub. No.: WO2015/025665
PCT Pub. Date: Feb. 26, 2015

(65) Prior Publication Data
US 2016/0179010 A1    Jun. 23, 2016

(30) Foreign Application Priority Data

Aug. 23, 2013 (JP) .................................. 2013-173646

(51) Int. Cl.
*H01L 21/027* (2006.01)
*G03F 7/40* (2006.01)
(Continued)

(52) U.S. Cl.
CPC .............. *G03F 7/40* (2013.01); *G03F 7/0752* (2013.01); *G03F 7/168* (2013.01); *G03F 7/20* (2013.01); *G03F 7/38* (2013.01); *H01L 21/0274* (2013.01)

(58) Field of Classification Search
None
See application file for complete search history.

(56) References Cited

U.S. PATENT DOCUMENTS

2015/0048046 A1* 2/2015 Dei ...................... C08G 77/388
216/2

FOREIGN PATENT DOCUMENTS

JP    2001-343757 A    12/2001
JP    2005-277052 A    10/2005
(Continued)

OTHER PUBLICATIONS

Sep. 16, 2014 Translation of Written Opinion issued in Japanese Patent Application No. PCT/JP2014/069341.
(Continued)

*Primary Examiner* — Asok K Sarkar
(74) *Attorney, Agent, or Firm* — Oliff PLC

(57) ABSTRACT

A coating liquid to be applied to resist pattern, which can be used in place of the conventional rinsing liquid. A coating liquid to be applied to a resist pattern having a polymer having a structural unit of the following Formula (1) and a structural unit of the following Formula (2), and a weight average molecular weight of 500 to 3,500, and a solvent containing water as a main component (1)

(Continued)

-continued $$-\!\!\left(\mathrm{SiO}_{4/2}\right)\!\!- \qquad (2)$$

(where $R^1$ is a $C_{1-8}$ organic group).

11 Claims, 6 Drawing Sheets

(51) Int. Cl.
  *G03F 7/075* (2006.01)
  *G03F 7/16* (2006.01)
  *G03F 7/20* (2006.01)
  *G03F 7/38* (2006.01)

(56) References Cited

FOREIGN PATENT DOCUMENTS

| | | |
|---|---|---|
| JP | 2010-020109 A | 1/2010 |
| WO | 2010/123032 A1 | 10/2010 |
| WO | 2012/128251 A1 | 9/2012 |

OTHER PUBLICATIONS

Sep. 16, 2014 Search Report issued in Japanese Patent Application No. PCT/JP2014/069341.

\* cited by examiner

COATING LIQUID TO BE APPLIED TO RESIST PATTERN AND METHOD FOR FORMING REVERSE PATTERN

TECHNICAL FIELD

The present invention relates to a coating liquid (rinsing liquid) that is used in a lithography process and can be applied to a resist pattern. The present invention also relates to a method for forming a reverse pattern using the coating liquid.

BACKGROUND ART

Conventionally, in production of a semiconductor device, a lithography process using a resist composition has been carried out. Due to miniaturization of a resist pattern to be formed by the lithography process, the resist pattern is likely to collapse. In particular, after development of an exposed resist film, collapse of the resist pattern often occurred due to flow of a rinsing liquid in a rinsing step or when drying the rinsing liquid. As the rinsing liquid, water containing an additive such as a surfactant and an organic acid or pure water has been typically used.

As a method for forming a pattern that suppresses occurrence of a failure due to the collapse of a resist pattern, Patent Document 1 describes a method for forming a pattern, characterized by including steps of: forming a resist film on a substrate; selectively irradiating an energy beam on the resist film to form a latent image in the resist film; supplying a developer (alkaline developer) onto the resist film to form a resist pattern from the resist film having the latent image; supplying a rising liquid onto the substrate to replace the developer on the substrate with the rinsing liquid; supplying a coating film material onto the substrate to replace at least a part of the rinsing liquid on the substrate with the coating film material, which contains a solvent and a solute different from the resist film; volatilizing the solvent in the coating film material to form a coating film covering the resist film on the substrate; removing at least a part of a surface of the coating film to expose at least a part of an upper surface of the resist pattern and to form a mask pattern formed by the coating film; and processing the substrate using the mask pattern.

As a developer that does not cause pattern collapse during formation of a finer pattern, Patent Document 2 discloses a developer containing a curable resin different from a curable resin forming a resist film and an organic solvent.

PRIOR ART DOCUMENTS

Patent Documents

Patent Document 1: Japanese Patent Application Publication No. 2005-277052 (JP 2005-277052 A)
Patent Document 2: International Publication WO 2012/128251

SUMMARY OF THE INVENTION

Problem to be Solved by the Invention

Since the invention described in Patent Document 1 includes the step of supplying a rinsing liquid on a substrate, the invention has not yet solved a problem of collapse of a resist pattern. The invention described in Patent Document 2 is a developer, which cannot be used in place of the conventional rinsing liquid in a rinsing step after formation of a resist pattern by development of an exposed resist film.

Means for Solving the Problems

The present inventors have intensively investigated to solve the above-described problems, and as a result, found that when a composition containing a polymer having a specific structural unit, a solvent containing water as a main component, and as necessary, a water-soluble organic acid and another additive is used as a coating liquid, a problem of collapse of a resist pattern at a rinsing step for the resist pattern can be solved, and a reverse pattern used as a mask at an etching step can be formed.

Specifically, the present invention is a coating liquid to be applied to a resist pattern comprising a polymer having a structural unit of the following Formula (1) and a structural unit of the following Formula (2), and a weight average molecular weight of 500 to 3,500, for example, 800 to 1,000, and a solvent containing water as a main component.

(where $R^1$ is a $C_{1-8}$ organic group.)

The polymer is a cohydrolysis-condensation product of a compound of the following Formula (3) with a compound of the following Formula (4):

$$R^1Si(OX)_3 \qquad (3)$$

$$Si(OY)_4 \qquad (4)$$

(where $R^1$ is a $C_{1-8}$ organic group, and X and Y are each independently methyl group or ethyl group).

The $C_{1-8}$ organic group is, for example, selected from the group consisting of methyl group, ethyl group, n-propyl group, isopropyl group, vinyl group, methacryloyloxy group, acryloyloxy group, epoxy group, and phenyl group.

The concentration of water in the solvent containing water as a main component is, for example, 90% by mass to 100% by mass. When the solvent contains a component (subcomponent) other than water, the component (subcomponent) is a water-soluble organic solvent. Examples of the water-soluble organic solvent include ethanol, n-propanol, and isopropanol.

The coating liquid of the present invention may further contain at least one water-soluble organic acid selected from the group consisting of maleic acid, formic acid, acetic acid, maleic anhydride, oxalic acid, citric acid, and phosphoric acid.

The concentration of the polymer in the coating liquid of the present invention is preferably 1% by mass to 10% by mass. As the concentration is higher, with 40% by mass as the upper limit, the thickness of a formed coating film can be increased.

The coating liquid of the present invention can be used in place of the conventional rinsing liquid. Therefore, the coating liquid can be referred to as rinsing liquid.

Another aspect of the present invention is a method for forming a reverse pattern comprising steps of: applying a positive resist solution to a substrate having an underlayer film, followed by prebaking, to form a resist film; exposing the resist film; baking (PEB: post exposure bake) the resist film after the exposure, and developing the resist film by an alkaline developer to from a resist pattern on the substrate having the underlayer film; applying the coating liquid of the present invention so as to fill at least a space of the resist pattern, and removing or decreasing a component other than the polymer contained in the coating liquid and the alkaline developer to form a coating film; etch-backing the coating film to expose a surface of the resist pattern; and removing the resist pattern.

The removing or decreasing the component other than the polymer contained in the coating liquid and the alkaline developer means, for example, spin-drying or heating after spin-drying the substrate having the underlayer film in which the coating liquid is applied. Herein, the spin-drying is drying a substrate while rotating the substrate. The component other than the polymer contained in the coating liquid is, for example, the solvent containing water as a main component, the water-soluble organic acid, or the other additive.

The step of removing the resist pattern is carried out, for example, by dry etching or ashing. Herein, when ashing is selected, the ashing needs to be carried out under a condition in which a substance other than the resist pattern, particularly the underlayer film is not removed.

Yet another aspect of the present invention is a method for producing a semiconductor device comprising after formation of a reverse pattern by the method of the present invention, a step of etching the substrate having the underlayer film using the reverse pattern as a mask. The step of etching the substrate having the underlayer film is carried out, for example, by dry etching.

Effects of the Invention

When the coating liquid of the present invention is used, a rinsing step using the conventional rinsing liquid is not necessary, and therefore, the collapse of a resist pattern can be suppressed. The main component of the solvent in the coating liquid of the present invention is water, and the water-soluble organic acid is optionally contained. Therefore, the coating liquid has an effect of removing a developer like the conventional rinsing liquid.

MODES FOR CARRYING OUT THE INVENTION

Hereinafter, embodiments of the present invention will be described in detail.

<Polymer>

It is necessary that the polymer contained in the coating liquid of the present invention be water-soluble, but not gel.

The polymer having the structural unit of Formula (1) and the structural unit of Formula (2) can be obtained by dissolving the compound of Formula (3) and the compound of Formula (4) in the solvent containing water as a main component, followed by a cohydrolysis-condensation reaction in the presence of a catalyst. Preferred examples of the catalyst include an inorganic acid such as hydrochloric acid, sulfuric acid, nitric acid, and phosphoric acid, and an organic acid such as formic acid, oxalic acid, fumaric acid, maleic acid, glacial acetic acid, acetic anhydride, propionic acid, and n-butyric acid. The amount of acid catalyst to be used is, for example, 0.001% by mass to 1% by mass, relative to the total amount of the compound of Formula (3) and the compound of Formula (4). The cohydrolysis-condensation reaction is carried out, for example, under a temperature condition of 30° C. to 80° C.

The structural unit of Formula (1) and the structural unit of Formula (2) in the polymer contained in the coating liquid of the present invention may form any structure of a random copolymer, a block copolymer, and an alternating copolymer.

<Additive>

When the coating liquid of the present invention contains the water-soluble organic acid, that is, at least one selected from the group consisting of maleic acid, formic acid, acetic acid, maleic anhydride, oxalic acid, citric acid, and phosphoric acid, the content thereof is, for example, 0.1% by mass to 10% by mass relative to the coating liquid of the present invention. This water-soluble organic acid may be referred to as a pH adjuster, and can adjust the storage stability of the coating liquid of the present invention.

To the coating liquid of the present invention, a surfactant may be added. The surfactant is an additive to improve the application properties of the coating liquid of the present invention. A known surfactant such as a nonionic surfactant and a fluorosurfactant can be used. The content thereof is, for example, 0.1% by mass to 5% by mass relative to the polymer contained in the coating liquid of the present invention.

Specific examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including Eftop (registered trademark) EF301, EF303, and EF352 (manufactured by Mitsubishi Materials Electronic Chemicals Co., Ltd.), MEGAFACE (registered trademark) F171, F173, R-30, R-30N, R-40, and R40-LM (manufactured by DIC Corporation), Fluorad FC430 and FC431 (manufactured by Sumitomo 3M Ltd.), AsahiGuard (registered trademark) AG710, and Surflon (registered trademark) S-382, SC101, SC102, SC103, SC104, SC105, and SC106 (manufactured by Asahi Glass Co., Ltd.), and organosiloxane polymer KP341 (manufactured by Shin-Etsu Chemical Co., Ltd.). To the coating liquid of the present invention, the surfactant may be added singly or two or more thereof may be added in combination.

As described above, the method for forming a reverse pattern of the present invention includes the step of applying a positive resist solution to a substrate having an underlayer film, followed by prebaking, to form a resist film. Examples of the substrate include a substrate used in production of a precision integrated circuit element (e.g., a semiconductor substrate such as a silicon substrate coated with a silicon oxide film, a silicon nitride film, or a silicon nitride oxide film, a silicon nitride substrate, a quartz substrate, an alkali-free glass substrate, a low alkaline glass substrate, a crystalline glass substrate, and a glass substrate having an ITO film). On the substrate, an organic film and/or inorganic film having an anti-reflective performance is formed as an underlayer film.

The positive resist solution is applied to the underlayer film by an appropriate coating method such as a spinner and a coater, and is dried, for example, by prebaking at a temperature of about 80° C. to about 180° C., to form a resist film. At that time, the resist film has, for example, a thickness of 10 nm to 1,000 nm. Examples of the positive resist solution include PAR710 and PAR855, manufactured by Sumitomo Chemical Co., Ltd., and AR2772JN manufactured by JSR Corporation.

In the step of exposing the resist film, the exposure is carried out using a source of light such as a visible light, an ultraviolet light, an extreme ultraviolet light (EUV), and an electron beam through a mask of predetermined pattern.

In the step of developing the exposed resist film by an alkaline developer to from a resist pattern on the substrate having the underlayer film, examples of the alkaline developer include inorganic alkalies such as sodium hydroxide, potassium hydroxide, sodium carbonate, sodium silicate, sodium metasilicate, and aqueous ammonia, and aqueous solutions of alkalies including primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine. A solution in which proper amounts of an alcohol such as isopropyl alcohol and a surfactant such as a nonionic surfactant are added to the aqueous solution of the alkali can be used. Among the developers, an aqueous solution of quaternary ammonium salt is preferred, and an aqueous solution of tetramethylammonium hydroxide is further preferred. In the present invention, a step of washing with the conventional rinsing liquid and drying is not necessary after development with the alkaline developer described above.

In the step of applying the coating liquid of the present invention so as to fill at least a space of the resist pattern, and removing or decreasing the component other than the polymer contained in the coating liquid and the alkaline developer to form a coating film, the coating liquid of the present invention is applied by an appropriate coating method such as a spinner and a coater. In a case of heating after spin-drying to remove or decrease the component other than the polymer and the alkaline developer, the solvent containing water as a main component in the coating film can be rapidly volatilized, for example, by heating at 80° C. to 180° C. At that time, the heating time is, for example, 10 seconds to 300 seconds. The thickness of the coating film is not particularly limited, and is, for example, 10 nm to 1,000 nm.

In the step of etch-backing the coating film to expose a surface of the resist pattern, the etch-backing is carried out, for example, by dry etching using a fluorine-containing gas such as $CF_4$, by wet etching using an aqueous solution of organic acid or organic base, or an organic solvent, or by a CMP method. A process condition can be appropriately adjusted.

In the step of removing the resist pattern, for example, a mixed gas of $O_2$ and $N_2$ or $O_2$ gas is used. From the coating film remaining after the removal of the resist pattern, a desired reverse pattern is formed. During dry etching, a known device can be used.

EXAMPLES

Hereinafter, the present invention will be described in detail with reference to Examples, but the present invention is not particularly limited to the Examples.

A weight average molecular weight shown in the following Synthesis Examples herein is a result measured by gel permeation chromatography (hereinafter abbreviated as GPC). A used measurement device and measurement conditions are as follows.

[GPC Condition]
GPC apparatus: HLC-8220GPC (manufactured by Tosoh Corporation)
GPC column: Shodex (registered trademark) KF803L, KF802, KF801 (manufactured by Showa Denko K.K.)
Column temperature: 40° C.
Solvent: tetrahydrofuran (THF)

Flow rate: 1.0 mL/min
Standard sample: polystyrene (manufactured by Showa Denko K.K.)

Synthesis Example 1

10.4165 g (50% by mole) of tetraethoxysilane, 8.915 g (50% by mole) of methyltriethoxysilane, 1.801 g of aqueous hydrochloric acid solution (0.01 mol/L), and 173.9835 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with propyleneglycol monoethyl ether (hereinafter abbreviated as PGEE), and GPC measurement was carried out. The weight average molecular weight (Mw) was 900.

Synthesis Example 2

2.5877 g (50% by mole) of tetramethoxysilane, 2.3157 g (50% by mole) of methyltrimethoxysilane, 0.6123 g of aqueous hydrochloric acid solution (0.01 mol/L), and 44.1313 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with PGEE, and GPC measurement was carried out. The weight average molecular weight (Mw) was 950.

Synthesis Example 3

3.5416 g (65% by mole) of tetraethoxysilane, 1.399 g (30% by mole) of methyltriethoxysilane, 0.2593 g (5% by mole) of phenyltrimethoxysilane, 0.4710 g of aqueous hydrochloric acid solution (0.01 mol/L), and 46.7989 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with PGEE, and GPC measurement was carried out. The weight average molecular weight (Mw) was 850.

Synthesis Example 4

3.5416 g (65% by mole) of tetraethoxysilane, 1.399 g (30% by mole) of methyltriethoxysilane, 0.2489 g (5% by mole) of vinyltetraethoxysilane, 0.4710 g of aqueous hydrochloric acid solution (0.01 mol/L), and 46.7050 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with PGEE, and GPC measurement was carried out. The weight average molecular weight (Mw) was 830.

Synthesis Example 5

3.5416 g (65% by mole) of tetraethoxysilane, 1.399 g (30% by mole) of methyltriethoxysilane, 0.3222 g (5% by mole) of 2-(3,4-epoxycyclohexyl)ethyltrimethoxysilane, 0.4710 g of aqueous hydrochloric acid solution (0.01 mol/L), and 47.3649 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with PGEE, and GPC measurement was carried out. The weight average molecular weight (Mw) was 880.

Synthesis Example 6

3.5416 g (65% by mole) of tetraethoxysilane, 1.399 g (30% by mole) of methyltriethoxysilane, 0.3248 g (5% by mole) of 3-(methacryloyloxy)propyltrimethoxysilane, 0.4710 g of aqueous hydrochloric acid solution (0.01 mol/L), and 47.3881 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with PGEE, and GPC measurement was carried out. The weight average molecular weight (Mw) was 920.

Synthesis Example 7

1.3451 g (50% by mole) of tetraethoxysilane, 1.159 g (50% by mole) of methyltriethoxysilane, 0.2341 g of aqueous hydrochloric acid solution (0.01 mol/L), and 47.7488 g of ion-exchanged water were placed in a flask, and stirred at room temperature for 2 hours. The mixture was then reacted in an oil bath at 40° C. for 10 hours to obtain a coating liquid (polymer concentration: 5% by mass). The polymer obtained in this Synthesis Example was diluted with PGEE, and GPC measurement was carried out. The weight average molecular weight (Mw) was 850.

Synthesis Example 8

5.2083 g (50% by mole) of tetraethoxysilane, 4.4575 g (50% by mole) of methyltriethoxysilane, 0.4005 g of aqueous hydrochloric acid solution (0.01 mol/L), and 38.663 g of ion-exchanged water were placed in a flask, and stirred at room temperature for 2 hours. The mixture was then reacted in an oil bath at 40° C. for 10 hours to obtain a coating liquid (polymer concentration: 20% by mass). The polymer obtained in this Synthesis Example was diluted with PGEE, and GPC measurement was carried out. The weight average molecular weight (Mw) was 910.

Synthesis Example 9

10.4165 g (50% by mole) of tetraethoxysilane, 8.915 g (50% by mole) of methyltriethoxysilane, 1.801 g of aqueous hydrochloric acid solution (0.01 mol/L), and 28.9973 g of ion-exchanged water were placed in a flask, and stirred at room temperature for 2 hours. The mixture was then reacted in an oil bath at 40° C. for 10 hours to obtain a coating liquid (polymer concentration: 40% by mass). The polymer obtained in this Synthesis Example was diluted with PGEE, and GPC measurement was carried out. The weight average molecular weight (Mw) was 930.

Synthesis Example 10

3.7499 g (50% by mole) of tetraethoxysilane, 1.3755 g (50% by mole) of methyltriethoxysilane, 0.4631 g of aqueous hydrochloric acid solution (0.01 mol/L), and 46.1286 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with PGEE, and GPC measurement was carried out. The weight average molecular weight (Mw) was 930.

Synthesis Example 11

1.6666 g (50% by mole) of tetraethoxysilane, 3.3283 g (50% by mole) of methyltriethoxysilane, 0.4803 g of aqueous hydrochloric acid solution (0.01 mol/L), and 44.9542 g of ion-exchanged water were placed in a flask, and stirred at room temperature for 2 hours. The mixture was then reacted in an oil bath at 40° C. for 10 hours to obtain a coating liquid (polymer concentration: 10% by mass). The polymer obtained in this Synthesis Example was diluted with PGEE, and GPC measurement was carried out. The weight average molecular weight (Mw) was 910.

Synthesis Example 12

17.7081 g (70% by mole) of tetraethoxysilane, 6.4952 g (30% by mole) of methyltriethoxysilane, 2.1869 g of aqueous hydrochloric acid solution (0.01 mol/L), 48.4065 g of ion-exchanged water, and 48.4065 g of acetone were placed in a flask, and stirred at room temperature. The mixture was then reacted in an oil bath at 40° C. for 24 hours. From the resulting reaction solution, acetone and hydrochloric acid were then removed by evaporation, and ion-exchanged water was further added to obtain a coating liquid (polymer concentration: 4% by mass). The polymer obtained in this Synthesis Example was diluted with PGEE, and GPC measurement was carried out. The weight average molecular weight (Mw) was 900.

Synthesis Example 13

13.5415 g (50% by mole) of tetraethoxysilane, 11.5895 g (50% by mole) of methyltriethoxysilane, 2.3413 g of aqueous hydrochloric acid solution (0.01 mol/L), 50.2619 g of ion-exchanged water, and 50.2619 g of acetone were placed in a flask, and stirred at room temperature. The mixture was then reacted in an oil bath at 40° C. for 24 hours. From the resulting reaction solution, acetone and hydrochloric acid were then removed by evaporation, and ion-exchanged water was further added to obtain a coating liquid (polymer concentration: 4% by mass). The polymer obtained in this Synthesis Example was diluted with PGEE, and GPC measurement was carried out. The weight average molecular weight (Mw) was 900.

Synthesis Example 14

13.5415 g (30% by mole) of tetraethoxysilane, 27.0422 g (70% by mole) of methyltriethoxysilane, 3.9022 g of aqueous hydrochloric acid solution (0.01 mol/L), 81.1672 g of ion-exchanged water, and 81.1672 g of acetone were placed in a flask, and stirred at room temperature. The mixture was then reacted in an oil bath at 40° C. for 24 hours. From the resulting reaction solution, acetone and hydrochloric acid were then removed by evaporation, and ion-exchanged water was further added to obtain a coating liquid (polymer concentration: 4% by mass). The polymer obtained in this Synthesis Example was diluted with PGEE, and GPC measurement was carried out. The weight average molecular weight (Mw) was 900.

Example 1

Figure 1:
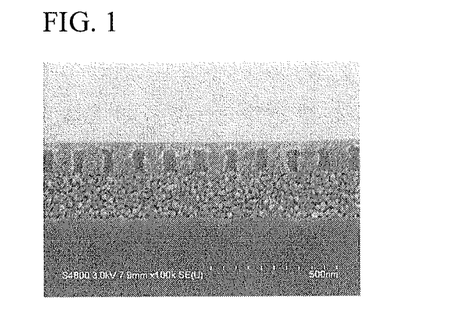
FIG. 1 is a view illustrating a cross-sectional SEM image after formation of a coating film on a resist pattern of a silicon substrate having an organic anti-reflective coating.

On a silicon substrate, an organic anti-reflective coating having a thickness of 200 nm was formed from a film-forming composition containing a copolymer having a structural unit of the following Formula (5) and an organic solvent. A resist solution for ArF (trade name: PAR855, manufactured by Sumitomo Chemical Co., Ltd.) was applied to the coating by a spinner. The silicon substrate was heated at 110° C. for 60 seconds on a hot plate to form a resist film having a thickness of 120 nm. The resist film was exposed by an exposure device for ArF excimer laser (S307E, manufactured by Nikon Corporation) under a predetermined condition. After the exposure for a line and space pattern with a target line width of 65 nm, the silicon substrate was subjected to heating (PEB) at 105° C. for 60 seconds, and cooled to room temperature on a cooling plate. Development was carried out for 30 seconds in a 2.38% by mass tetramethylammonium hydroxide (TMAH) aqueous solution, to form a resist pattern on the organic anti-reflective coating. To the resist pattern, the coating liquid obtained in Synthesis Example 1 was applied by a spinner, to form a coating film. A method for forming this coating film will be described in detail. The coating liquid was first placed on an entire resist pattern-forming surface of the silicon substrate, and allowed to stand for 5 seconds. The silicon substrate was spun at 1,500 rpm for 30 seconds, and then baked at 100° C. for 60 seconds, to form the coating film. It was confirmed whether a space of the resist pattern is filled with the coating film by a cross-sectional SEM. The result is shown in FIG. 1.

(5)

Example 2

Figure 2:
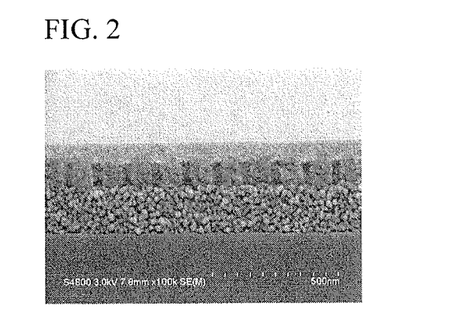
FIG. 2 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 2. The result confirmed by a cross-sectional SEM is show in FIG. 2.

Example 3

Figure 3:
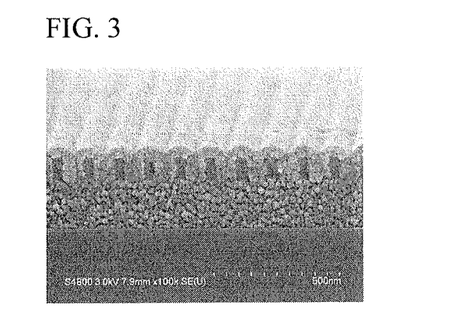
FIG. 3 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 3. The result confirmed by a cross-sectional SEM is shown in FIG. 3.

Example 4

Figure 4:
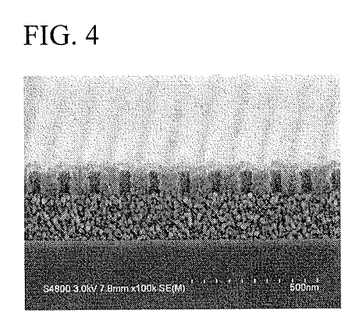
FIG. 4 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 4. The result confirmed by a cross-sectional SEM is shown in FIG. 4.

Example 5

Figure 5:
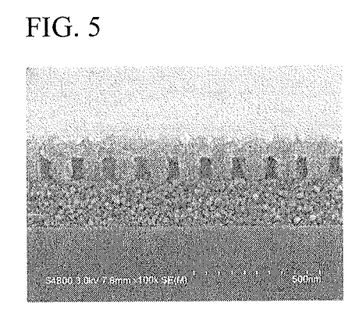
FIG. 5 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 5. The result confirmed by a cross-sectional SEM is shown in FIG. 5.

Example 6

Figure 6:
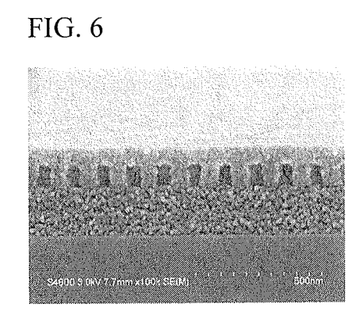
FIG. 6 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 6. The result confirmed by a cross-sectional SEM is shown in FIG. 6.

Example 7

Figure 7:
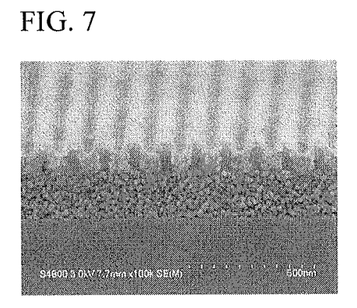
FIG. 7 is a view illustrating a cross-sectional SEM image after formation of a coating film on a resist pattern of a silicon substrate having an organic anti-reflective coating.

The same process as in Example 1 except was carried out that the coating liquid obtained in Synthesis Example 1 was changed to the coating liquid obtained in Synthesis Example 7. The result confirmed by a cross-sectional SEM is shown in FIG. 7.

Example 8

Figure 8:
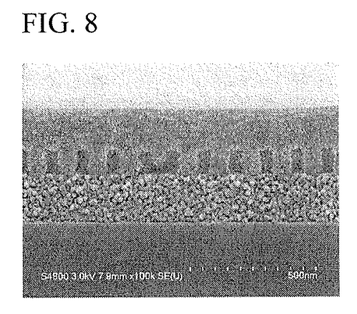
FIG. 8 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 8. The result confirmed by a cross-sectional SEM is shown in FIG. 8.

Example 9

Figure 9:
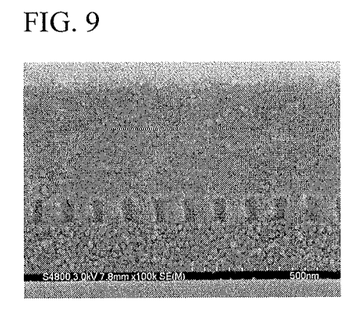
FIG. 9 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 9. The result confirmed by a cross-sectional SEM is shown in FIG. 9.

Example 10

Figure 10:
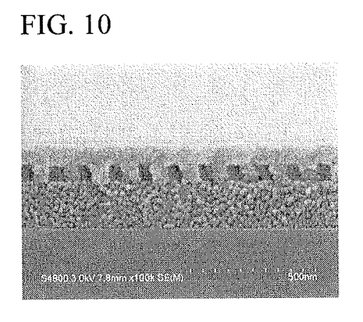
FIG. 10 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 10. The result confirmed by a cross-sectional SEM is shown in FIG. 10.

Example 11

Figure 11:
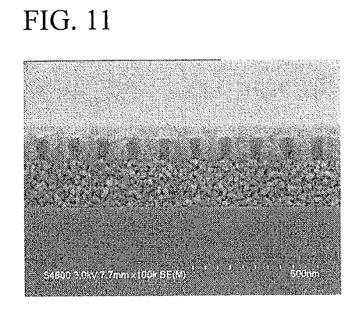
FIG. 11 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 11. The result confirmed by a cross-sectional SEM is shown in FIG. 11.

Example 12

Figure 12:
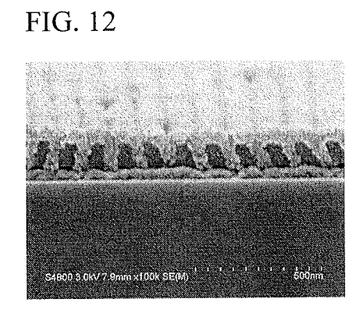
FIG. 12 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 12. The result confirmed by a cross-sectional SEM is shown in FIG. 12.

Example 13

Figure 13:
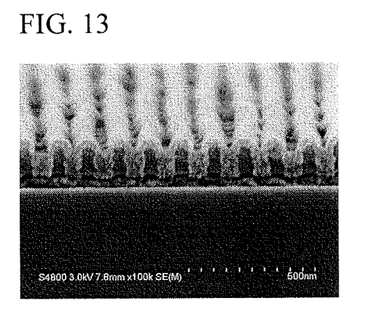
FIG. 13 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 13. The result confirmed by a cross-sectional SEM is shown in FIG. 13.

Example 14

Figure 14:
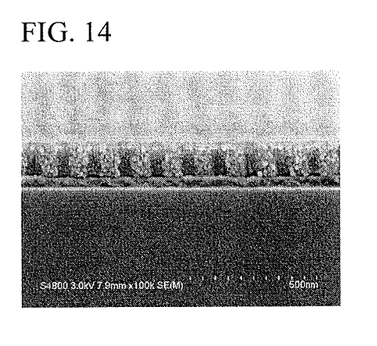
FIG. 14 is a view illustrating a cross-sectional SEM image after formation of a coating film on a resist pattern of a silicon substrate having an organic anti-reflective coating.

The same process as in Example 1 was carried out except that the coating liquid obtained in Synthesis Example 1 was changed to the coating liquid obtained in Synthesis Example 14. The result confirmed by a cross-sectional SEM is shown in FIG. 14.

Comparative Example 1

Figure 15:
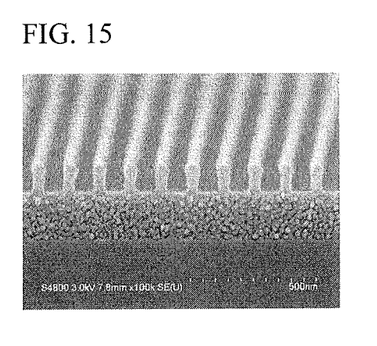
FIG. 15 is a view illustrating a cross-sectional SEM image of a resist pattern of a silicon substrate having an organic anti-reflective coating.

The same process as in Example 1 was carried out except that the coating liquid obtained in Synthesis Example 1 was changed to pure water. The result confirmed by a cross-sectional SEM is shown in FIG. 15.

FIGS. 1 to 14 show that a space of the resist pattern is filled with the coating film. On the other hand, FIG. 15 shows that the coating film is not present in a space of the resist pattern.

Example 15

Figure 16:
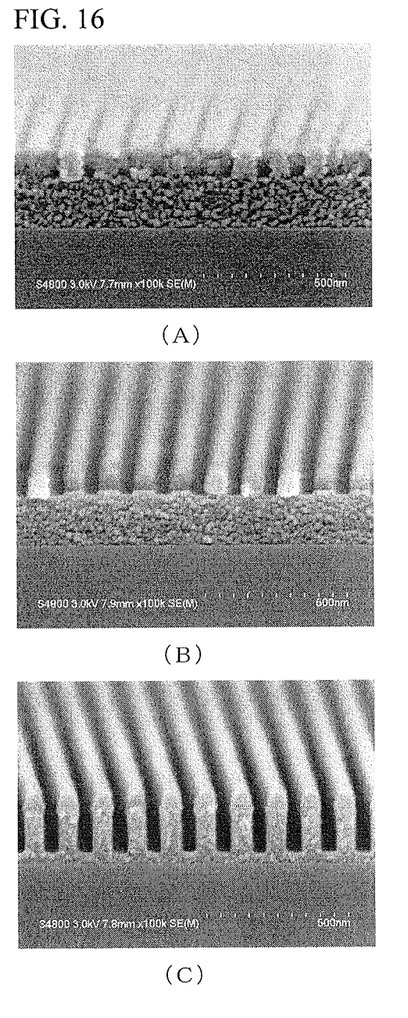
FIG. 16A is a view illustrating a cross-sectional SEM image of a coating film and a resist pattern after etch-backing.
FIG. 16B is a view illustrating a cross-sectional SEM image of a reverse pattern obtained after removal of the resist pattern.
FIG. 16C is a view illustrating a cross-sectional SEM image of an organic anti-reflective coating after etching.

The coating film formed in Example 1 was etch-backed by dry etching using a mixed gas of $CF_4$ (flow rate: 50 sccm) and Ar (flow rate: 200 sccm) to expose an upper portion of the resist pattern. The coating film and the resist pattern after the etch-backing were confirmed by a cross-sectional SEM. The result is shown in FIG. 16A.

The resist pattern was removed by dry etching using a mixed gas of $O_2$ (flow rate: 10 sccm) and $N_2$ (flow rate: 20 sccm) to obtain a reverse pattern. The reverse pattern obtained after the removal of the resist pattern was confirmed by a cross-sectional SEM. The result is shown in FIG. 16B.

The organic anti-reflective coating on the silicon substrate was further etched through the reverse pattern as a mask by dry etching using a mixed gas of $O_2$ (flow rate: 10 sccm) and $N_2$ (flow rate: 20 sccm). The organic anti-reflective coating after the etching was confirmed by a cross-sectional SEM. The result is shown in FIG. 16C.

The invention claimed is:

1. A coating liquid to be applied to a resist pattern comprising
    a polymer having a structural unit of the following Formula (1) and a structural unit of the following Formula (2), and a weight average molecular weight of 500 to 3,500, where $R^1$ is a $C_{1-8}$ organic group; and
    a solvent containing water as a main component; wherein
        the concentration of water in the solvent containing water as a main component is 90% by mass to 100% by mass, and
        when the solvent contains a component other than water, the component is a water-soluble organic solvent.

2. The coating liquid according to claim 1, wherein the polymer is a cohydrolysis-condensation product of a compound of the following Formula (3) with a compound of the following Formula (4):

$$R^1Si(OX)_3 \quad (3)$$

$$Si(OY)_4 \quad (4)$$

where $R^1$ is a $C_{1-8}$ organic group, and X and Y are each independently methyl group or ethyl group.

3. The coating liquid according to claim 1, wherein the $C_{1-8}$ organic group is selected from the group consisting of methyl group, ethyl group, n-propyl group, isopropyl group, vinyl group, methacryloyloxy group, acryloyloxy group, epoxy group, and phenyl group.

4. The coating liquid according to claim 1, further comprising at least one water-soluble organic acid selected from the group consisting of maleic acid, formic acid, acetic acid, maleic anhydride, oxalic acid, citric acid, and phosphoric acid.

5. The coating liquid according to claim 1, wherein the concentration of the polymer is 1% by mass to 10% by mass.

6. The coating liquid according to claim 1, which is a rinsing liquid.

7. A method for forming a reverse pattern comprising steps of:
applying a positive resist solution to a substrate having an underlayer film, followed by prebaking, to form a resist film;
exposing the resist film;
baking the resist film after the exposure, and developing the resist film by an alkaline developer to from a resist pattern on the substrate having the underlayer film;
applying the coating liquid according to claim 1 so as to fill at least a space of the resist pattern, and removing or decreasing a component other than the polymer contained in the coating liquid and the alkaline developer to form a coating film;
etch-backing the coating film to expose a surface of the resist pattern; and
removing the resist pattern.

8. The method for forming a reverse pattern according to claim 7, wherein the component other than the polymer contained in the coating liquid and the alkaline developer are removed or decreased by spin-drying or heating after spin-drying the substrate having the underlayer film in which the coating liquid is applied.

9. The method for forming a reverse pattern according to claim 7, wherein the step of removing the resist pattern is carried out by dry etching or ashing.

10. A method for producing a semiconductor device comprising after formation of a reverse pattern by the method according to claim 7, a step of etching the substrate having the underlayer film using the reverse pattern as a mask.

11. The coating liquid according to claim 1, wherein the polymer has a weight average molecular weight of 800 to 1,000.

* * * * *